United States Patent [19]
Sawada et al.

[11] Patent Number: 5,144,388
[45] Date of Patent: Sep. 1, 1992

[54] SEMICONDUCTOR DEVICE HAVING A PLURALITY OF FETS FORMED IN AN ELEMENT AREA

[75] Inventors: Shizuo Sawada; Masaki Ogihara, both of Yokohama, Japan

[73] Assignee: Kabushiki Kaisha Toshiba, Kawasaki, Japan

[21] Appl. No.: 664,827

[22] Filed: Mar. 5, 1991

[30] Foreign Application Priority Data

Mar. 7, 1990 [JP] Japan .................................. 2-53745

[51] Int. Cl.$^5$ ............................................. H01L 29/78
[52] U.S. Cl. ................................. 357/23.4; 357/23.1; 357/23.11; 357/23.14; 357/22; 357/68
[58] Field of Search .................... 357/23.1, 23.4, 23.11, 357/23.14, 68, 22 I, 22 H, 22 G, 22 E

[56] References Cited

U.S. PATENT DOCUMENTS 3,355,598 11/1967 Tuska .
4,807,002 2/1989 Donzelli .............................. 357/23.1

FOREIGN PATENT DOCUMENTS 239250 9/1987 European Pat. Off. .
0268172 10/1989 Japan ................................. 357/23.4
0158171 6/1990 Japan ................................. 357/23.4

OTHER PUBLICATIONS

Patent Abstracts of Japan, vol. 8, No. 53 (E-231) Mar. 9, 1984, and JP-A-58 207677 (Nihon Denki Aishii Maikon System) Dec. 3, 1983.
Patent Abstracts of Japan, vol. 12, No. 375 (E-666) Oct. 7, 1988 & JP-A-63 122276 (NEC Corp) May 26, 1988.
Patent Abstracts of Japan, vol. 10, No. 168 (E-411) (2224) Jun. 14, 1986) & JP-A-61 19174 (Toshiba K.K.) Jan. 28, 1986.

*Primary Examiner*—Georgia Y. Epps
*Attorney, Agent, or Firm*—Banner, Birch, McKie & Beckett

[57] ABSTRACT

According to this invention, in an element region formed in a semiconductor substrate, a plurality of regions for constituting one electrode of source and drain electrodes of an FET are formed. A gate electrode is formed to surround the plurality of regions. The other electrode of the FET is formed in the element region except for the plurality of regions surrounded by the gate electrode.

46 Claims, 14 Drawing Sheets

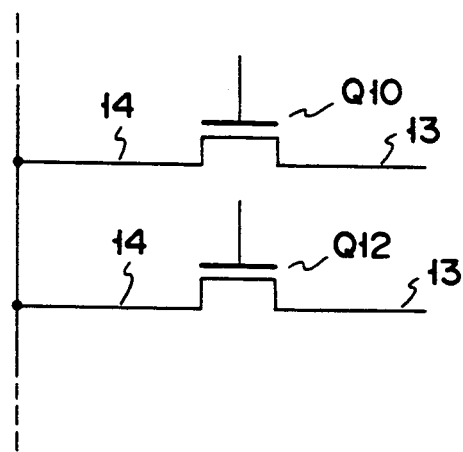
F I G. 3

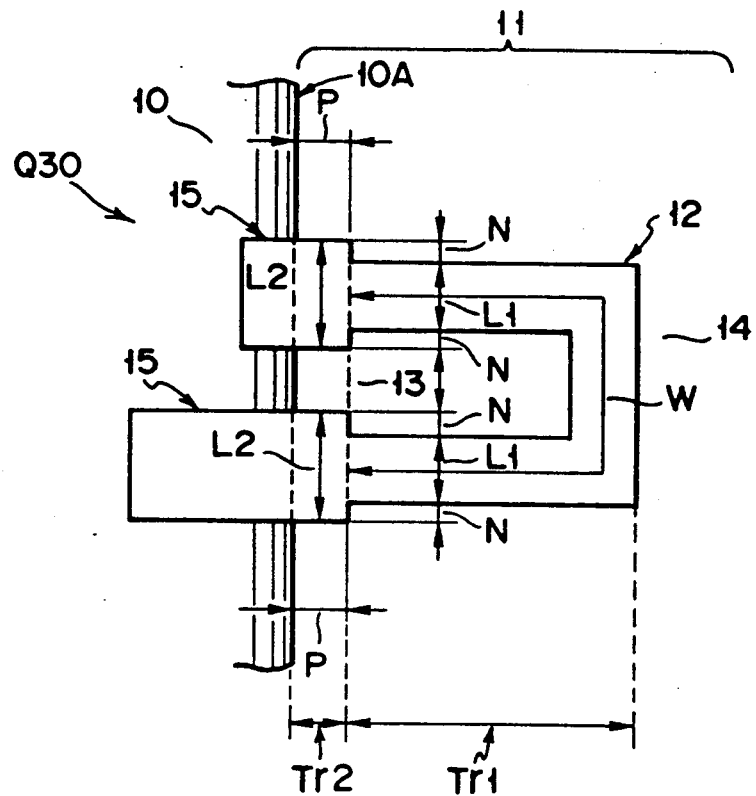
F I G. 11
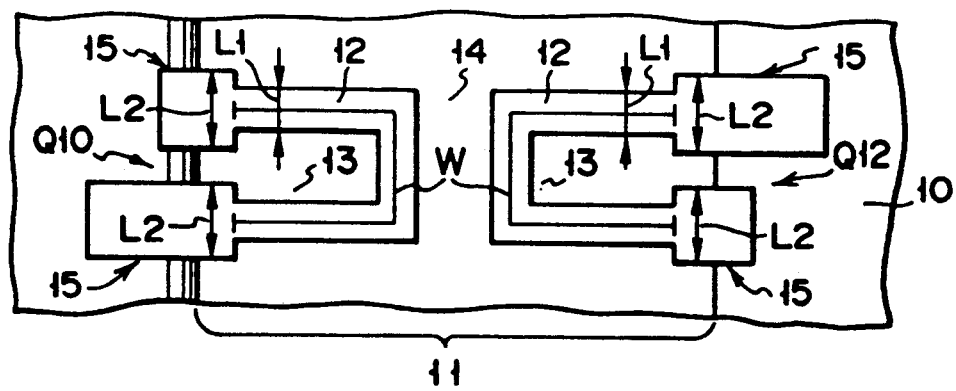
F I G. 12

SEMICONDUCTOR DEVICE HAVING A PLURALITY OF FETS FORMED IN AN ELEMENT AREA

BACKGROUND OF THE INVENTION

1. Field of the Invention

The present invention relates to a semiconductor device having a FET and, more particularly, to improvement of an integration density of the semiconductor device.

2. Description of the Related Art

FIG. 1 is a plan view of a pattern showing a conventional MOSFET.

In FIG. 1, reference numeral 10 denotes a field region. An element region 11 in which MOSFETs are formed is isolated by the field region 10. MOSFETs Q100 and Q102 are formed in the element region 11. Each of the MOSFETs Q100 and Q102 consists of a gate electrode 12, a source region 13, and a drain region 14. The source and drain regions 13 and 14 are formed on both sides of the gate electrode 12.

As described above, in a conventional technique, the MOSFETs Q100 and Q102 ar isolated from each other by the field region 10. For this reason, a ratio of an area required for the field region 10 to an area of a chip is necessarily increased, and a semiconductor device consisting of a plurality of MOSFETs cannot obtain a high integration density.

SUMMARY OF THE INVENTION

The present invention has been made in consideration of the above problem, and has as its object to increase an integration density of a semiconductor device having a plurality of FETs and to provide a high density semiconductor device.

The above object can be achieved by a semiconductor device comprising:

a semiconductor substrate having a major surface on which an element isolation region and an element region are formed;

a region constituting first electrode of FET formed in said element region;

a gate electrode formed on said major surface, having two ends arranged on said element isolation region, and surrounding said region constituting first electrode of FET; and second electrode of FET formed in said element region except for s id region constituting first electrode of FET. Thus, an integrated circuit consisting of a plurality of FETs independently using one electrode and the other common electrode can be formed in the element region, thereby obtaining a semiconductor device having a high integration density.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is an equivalent circuit diagram showing the MOSFET in FIG. 2;

FIG. 11 is a plan view of a pattern showing a MOSFET according to the fifth embodiment of the present invention;

FIGS. 12 to 14 are plan views of patterns showing MOSFETs according to modifications of the fifth embodiment of the present invention;

DETAILED DESCRIPTION OF THE PREFERRED EMBODIMENTS

Embodiments of the present invention will be described below with reference to the accompanying drawings.

First Embodiment

Figure 1:
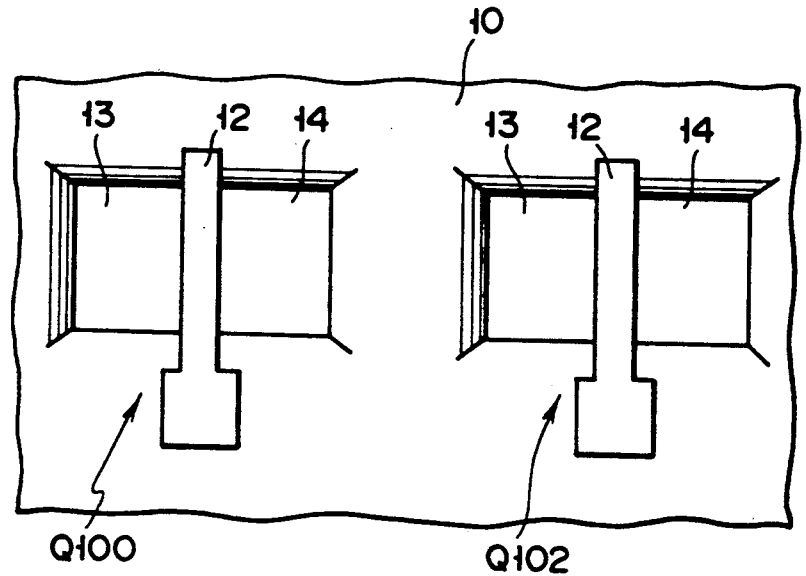
FIG. 1 is a plan view of a pattern showing a conventional MOSFET.
Figure 2:
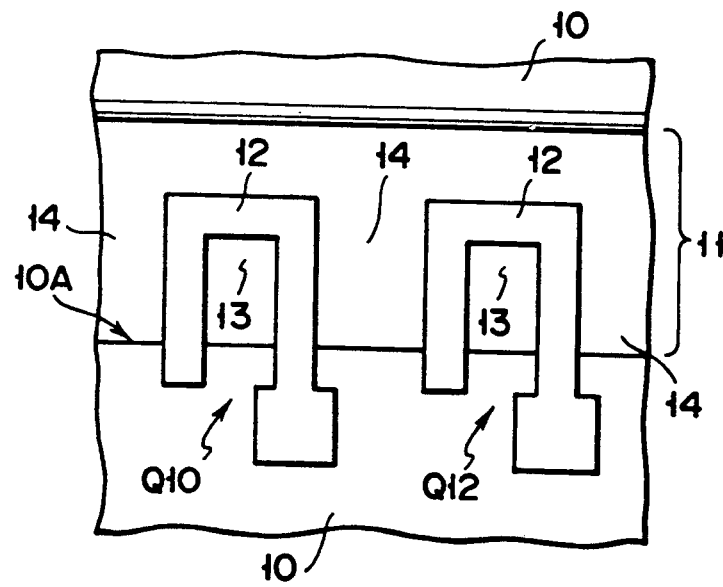
FIG. 2 is a plan view of a pattern showing a MOSFET according to the first embodiment of the present invention.

FIG. 2 is a plan view of a pattern showing a MOSFET according to the first embodiment of the present invention, and FIG. 3 is an equivalent circuit diagram thereof.

As shown in FIG. 2, MOSFETs Q10 and Q12 are formed in an element region 11 isolated by a field oxide region 10. Each of the gate electrodes 12 of the MOSFETs Q10 and Q12 has a U-shaped two-dimensional pattern, both the ends of the gate electrode 12 are formed to cover the field region 10, and the central portion of the gate electrode 12 is formed in the element region 11. A portion of the element region 11 is surrounded by the U-shaped gate electrode 12, and the surrounded portion 13 is used as one electrode (to be referred to as a drain electrode 13 hereinafter) of the MOSFET. The remaining region 14 of the element region 11 serves as the other electrode (to be referred to as a source electrode 14 hereinafter) of the MOSFET.

According to the semiconductor device having the above arrangement, each of the gate electrodes 12 of the MOSFETs Q10 and Q12 has a U shaped two-dimensional pattern, and both the ends of each of the U-shaped gate electrodes 12 extend to a field region end 10A, thereby surrounding a portion of the element region 11. In other words, the portion of the element region 11 is surrounded by the U-shaped gate electrode 12 and the field region 10, thereby independently forming the drain regions 13 in the MOSFETs Q10 and Q12. The source electrode 14 is formed in the element region 11 except for the portion serving as the drain electrodes 13, and the source electrode 14 is commonly used in the MOSFETs Q10 and Q12. Therefore, a semiconductor integrated circuit consisting of the MOSFETs Q10 and Q12 commonly using the source electrode 14 and independently using the drain electrodes 13 can be obtained.

According to the above embodiment, when a circuit shown in FIG. 3 is formed in a semiconductor substrate, a field region for separating the drain electrodes 14 from each other is not required, and the area of the field region 10 can be decreased. Therefore, the above circuit can be integrated at a high density.

In the first embodiment, the drain electrode may be used as a source electrode, and the source electrode 14 may be used as a drain electrode. This applies to the following embodiments to be described later.

Figure 4:
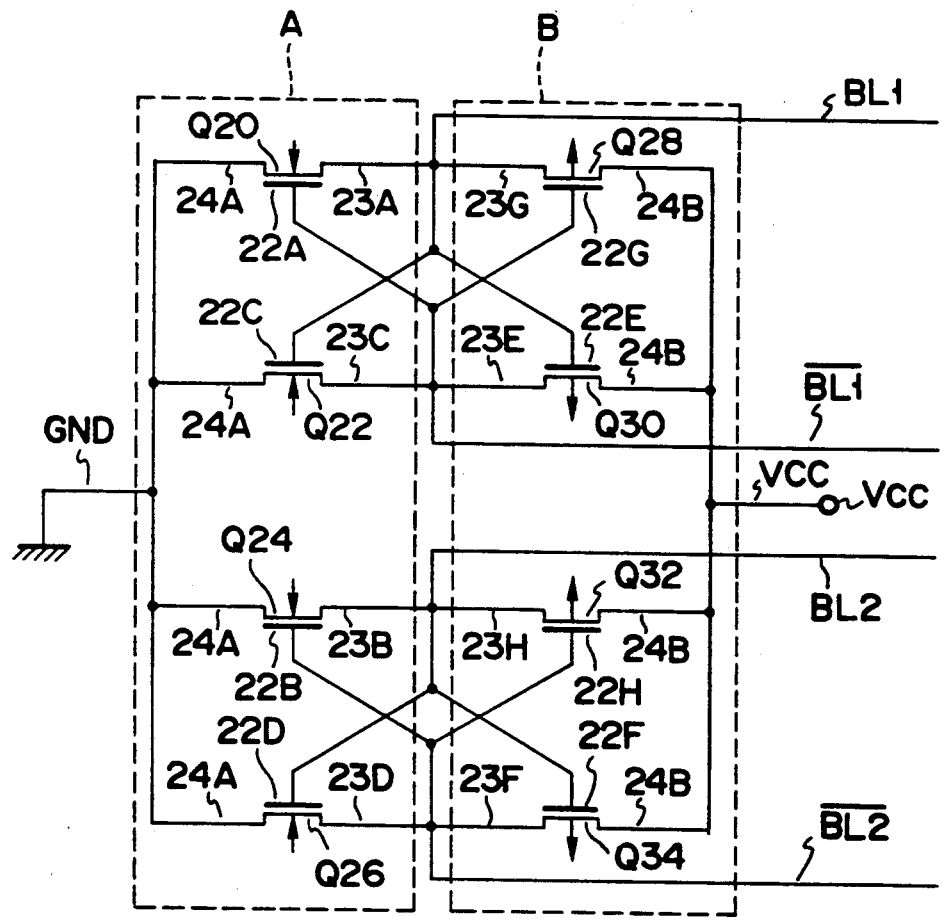
FIG. 4 is a circuit diagram showing a sense amplifier (CMOS type)

As a circuit device consisting of the circuits shown in FIG. 3, a sense amplifier or the like for amplifying a potential difference between a pair of wires is available. FIG. 4 is a circuit diagram of the sense amplifier (CMOS type). In this sense amplifier, a part corresponding to the circuit shown in FIG. 3 is given as parts surrounded by broken-line frames A and B in FIG. 4.

Figure 5A:
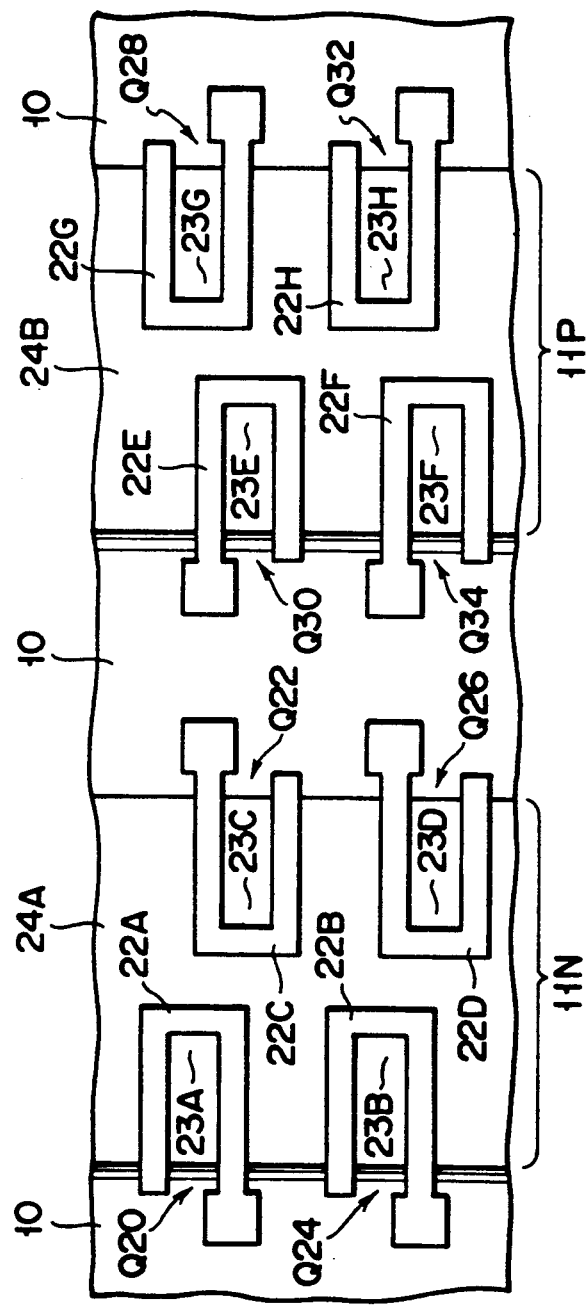
FIG. 5A is a plan view of a pattern showing an arrangement wherein the sense amplifier in FIG. 4 consists of MOSFETs according to the present invention and, more particularly, showing a pattern of an arrangement of a gate electrode.
Figure 5B:
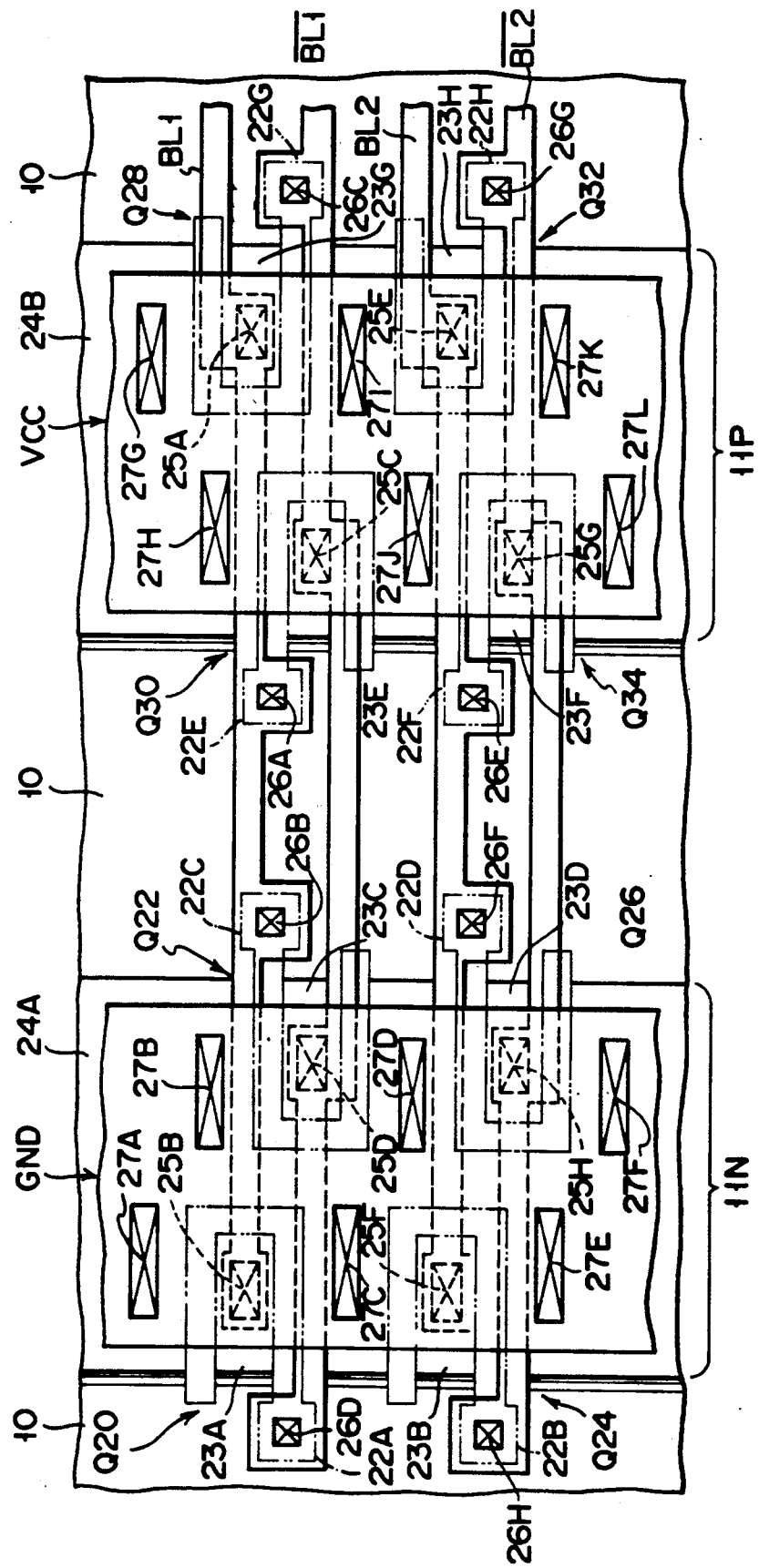
FIG. 5B is a plan view of a pattern showing an arrangement wherein the sense amplifier in FIG. 4 consists of MOSFETs according to the present invention, and showing a condition wherein the MOSFETs are connected to each other by wiring.

FIGS. 5A and 5B are plan views of a pattern showing an arrangement wherein the sense amplifier in FIG. 4 consists of MOSFETs according to the present invention. FIG. 5A is a plan view of a pattern showing an arrangement of a gate electrode, and FIG. 5B is a plan view of a pattern showing a condition wherein the MOSFETs are connected to each other by wiring. The same reference numerals as in FIGS. 2 and 4 denote the same parts in FIGS. 5A and 5B.

As shown in FIGS. 5A and 5B, the surface of a semiconductor substrate is divided into an element region 11N for forming an n-channel MOSFET and an element region 11P for forming a p-channel MOSFET by the field region 10. N-channel MOSFETs Q22 to Q26 are formed in the element region 11N, and p-channel MOSFETs Q28 to Q34 are formed in the element region 11P. The n-channel MOSFETs are to be referred to as NMOSs, and the p-channel MOSFETs are to be referred to as PMOSs hereinafter.

The MOSFETs Q20 to Q34 have U-shaped gate electrodes 22A to 22H, respectively. The U-shaped gate electrodes 22A to 22H surround portions of the element regions 11N and 11P, and drain electrodes 23A to 23H are respectively formed on the surrounded portions. Source electrodes 24A and 24B are formed in the element regions 11N and 11P except for the surrounded portions.

Connection of active elements is performed as described below.

A bit line BL1 consisting of a conductive film such as a silicide film or an aluminum film is connected to a drain 23G of the PMOS Q28 through a contact hole 25A, connected to the gate 22E of the PMOS 30 through a contact hole 26A, connected to the gate 22C of the NMOS Q22 through a contact hole 26B, and connected to the drain 23A of the NMOS Q20 through the contact hole 25B. As in the above description, a bit line $\overline{BL1}$ is connected to the gate 22G of the PMOS Q28 through a contact hole 26C, connected to the drain 23E of the PMOS Q30 through a contact hole 25C, connected to the drain 23C of the NMOS Q22 through a contact hole 25D, and connected to the gate 22A of the NMOS Q20 through a contact hole 26D. A bit line BL2 is connected to the drain 23H of the PMOS Q32 through a contact hole 25E, connected to the gate 22F of the PMOS Q34 through a contact hole 26E, connected to the gate 22D of the NMOS Q26 through a contact hole 26F, and connected to the drain 23B of the NMOS Q24 through a contact hole 25F. A bit line $\overline{BL2}$ is connected to the gate 22H of the PMOS Q32, connected to the drain 23F of the PMOS Q34 through a contact hole 25G, connected to the drain 23F of the PMOS Q34 through a contact hole 25G, connected to the drain 23D of the NMOS Q26 through a contact hole 25H, and connected to the gate 22B of the NMOS Q24 through a contact hole 26H. The source 24A is commonly used in the NMOSs Q20 to Q24, consists of a conductive film such as an aluminum film, and is connected to a ground wire GND through contact holes 27A to 27F. The source 24B is commonly used in the PMOSs Q28 to Q34 and connected to a wire VCC having a high potential, e.g., 5 V, through contact holes 27G to 27L.

The present invention is applied to the above sense amplifier, thereby obtaining a sense amplifier having a high integration density.

Figure 6:
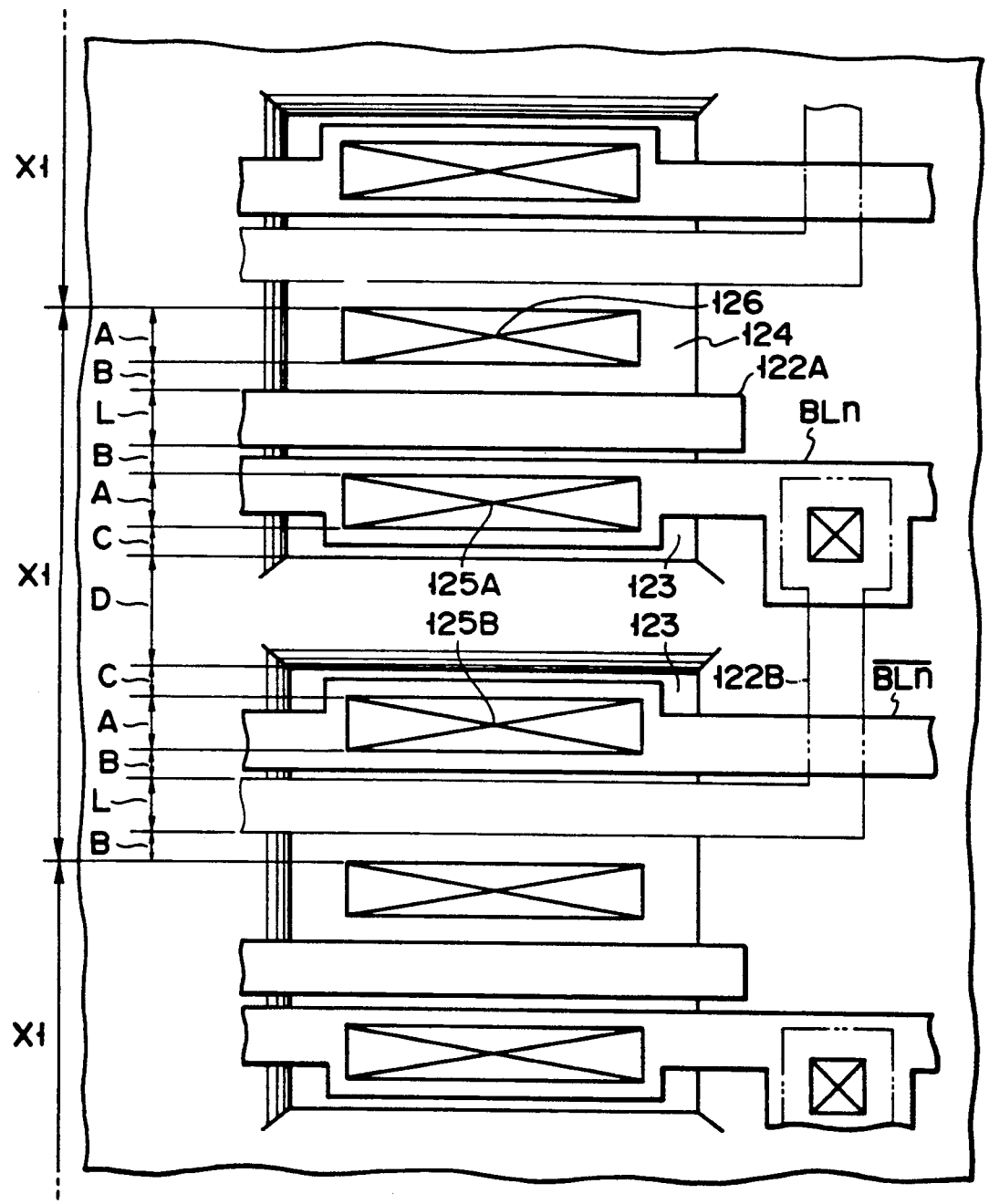
FIG. 6 is a plan view of a pattern showing an arrangement wherein the sense amplifier in FIG. 4 consists of conventional MOSFETs.
Figure 7:
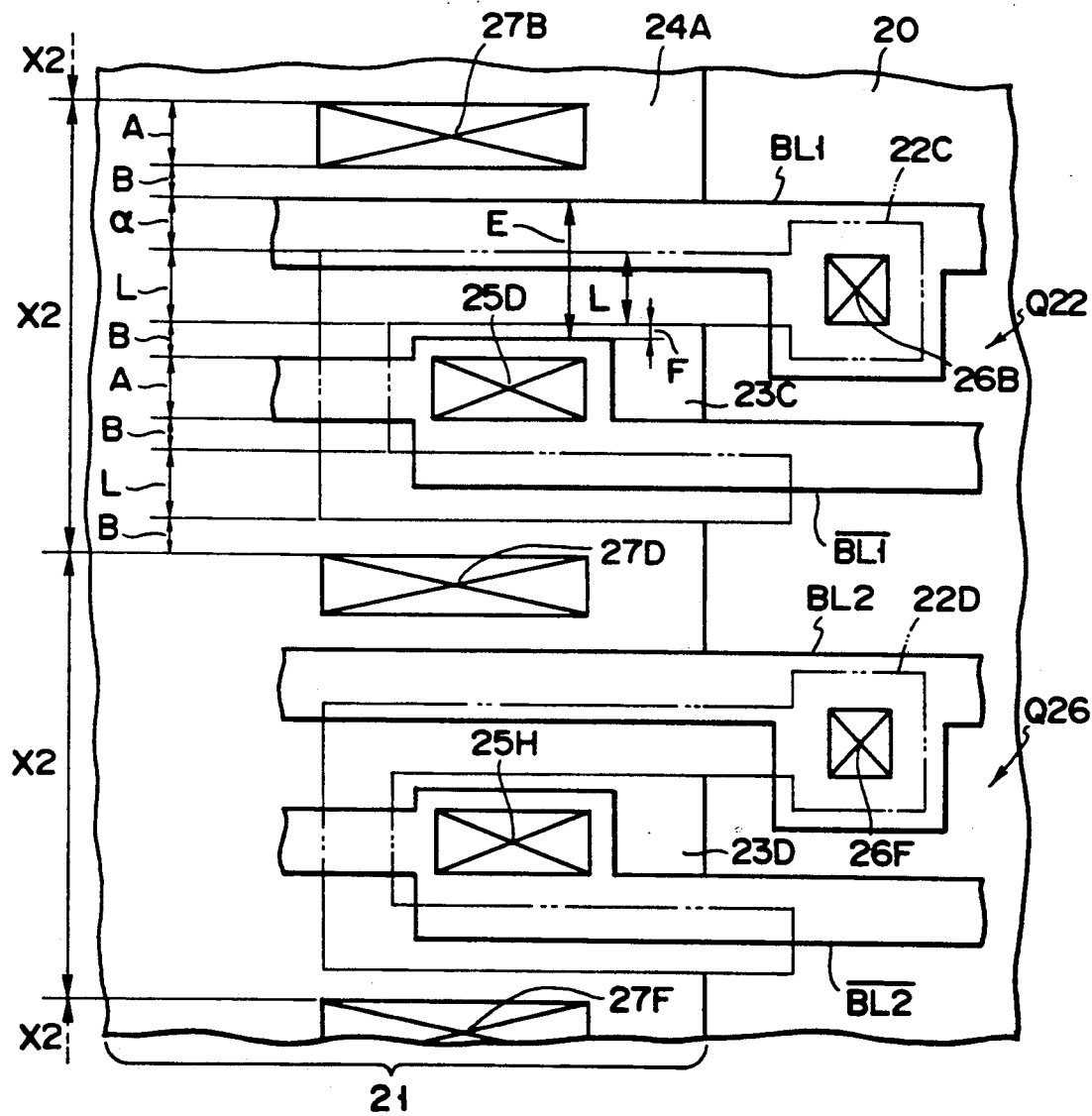
FIG. 7 is a plan view of a pattern showing a part extracted from FIG. 5B.

An effect of an increase in integration density of the sense amplifier having the above arrangement will be described below with reference to FIGS. 6 and 7. FIG. 6 is a plan view of a pattern showing an arrangement wherein the sense amplifier (FIG. 4) consists of conventional MOSFETs, and the plan view showing a part extracted from the pattern. FIG. 7 is a plan view of a pattern showing a part extracted from FIG. 5B.

In a conventional sense amplifier shown in FIG. 6, an interval X1 between MOSFETs connected to a pair of bit lines BLn and BLn is given by equation (1):

$$X1 = 3A + 2L + 4B + 2C + D \qquad (1)$$

In equation (1), reference symbol A denotes the width of a contact; L, a gate length.; D, the width of a field region; B, a distance between the gate and the contact (including a margin for mask alignment); and C, a distance between the contact and the field region (including a margin for mask alignment).

According to the present invention, as shown in FIG. 7, an interval X2 of MOSFETs connected to the pair of bit lines BL1 and $\overline{BL1}$ is given by equation (2):

$$X2 = 2A + 2L + 4B + \alpha \qquad (2)$$

In equation (2), reference symbol A denotes the width of a contact; L, a gate length; B, a distance between the gate and the contact (including a margin for mask alignment); and $\alpha$, an extending amount of a bit line BL from the gate. In the pattern shown in FIG. 7, the extending amount $\alpha$ is equal to a value obtained by subtracting a sum of gate length L and a distance F between a wire end and the gate from a patterning limit value E of a wire (bit line). Note that, in a practical pattern, the extending amount α is substantially equal to the width A of the contact.

In equation (2), the extending amount α need not be required. For example, when the bit line BL does not extend from the upper portion of the gate due to a change in pattern, the extending amount α is removed from equation (2). Therefore, according to the present invention, the interval X2 is given by equation (3) when a integration density is maximally increased.

$$X2 = 2A + 2L + 4B \quad (3)$$

As a result, as is apparent from equation (1) according to a conventional technique and equation (3) according to the present invention, the interval of the MOSFETs is decreased as follows:

$$\begin{aligned} X1 - X2 &= 3A + 2L + 4B + 2C + \\ &\quad D - (2A + 2L + 4B) \\ &= A + 2C + D \end{aligned} \quad (4)$$

In equations (1) to (3), when a design rule is set to be 1.0, the values A, B, C, D, and L are given as follows.

$$A = L = D = 1.0 \ \mu m \quad (5)$$

$$B = C = 0.8 \ \mu m \quad (6)$$

When equations (5) and (6) are substituted in equations (1) and (3), the following values are given.

$$X1 = 10.8 \ \mu m$$

$$X2 = 7.2 \ \mu m$$

Therefore, a difference between the intervals X1 and X2 is given by the following equation:

$$X1 - X2 = A + 2C + D = 3.6 \ \mu m$$

When the design rule is set to be 1.0, an interval between MOSFETs connected to a pair of bit lines can be decreased by about 3.6 μm as compared with that of a conventional technique. In addition, when an extending amount α is set as in equation (2), even if α = 0.8 μm is satisfied, the interval can Le decreased by about 2.8 μm.

Second Embodiment

Since the sense amplifier shown in FIG. 4 has a function for amplifying a potential difference between a pair of bit lines, matching of transistors must be considered in a combination of NMOSs Q20 and Q22 or NMOSs Q24 and Q26. In order to improve this matching, the characteristics of the NMOSs Q20 and Q22 are equal to each other. In the second embodiment, the matching is considered, and a sense amplifier consists of transistors having good matching.

Figure 8:
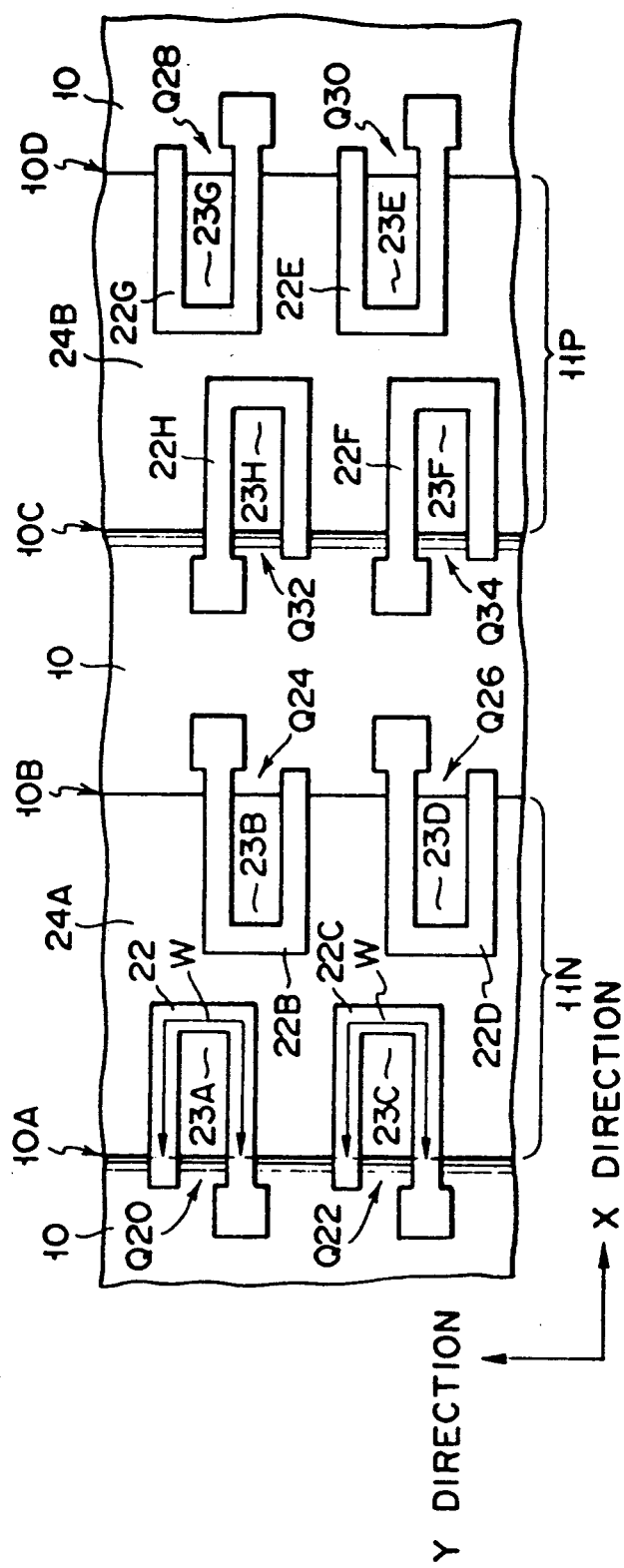
FIG. 8 is a plan view of a pattern showing a MOSFET according to the second embodiment of the present invention.

FIG. 8 is a plan view of a pattern showing a MOSFET according to the second embodiment. The same reference numerals as in FIG. 5A denote the same parts in FIG. 8, and a detailed description thereof will be omitted.

As shown in FIG. 8, the gate electrodes of two transistors required to have good matching are formed to be in contact with the end of a field region 10 along one direction thereof. For example, an element region 11N has two ends along a Y direction, as indicated by reference numerals 10A and 10B. The gates 22 and 22C of the NMOSs Q20 and Q22 required to have good matching are formed to be adjacent to, e.g., the end 10A, and the gates 22B and 22D of the NMOSs Q24 and 26 are formed to be adjacent to the end 10B.

Figure 10:
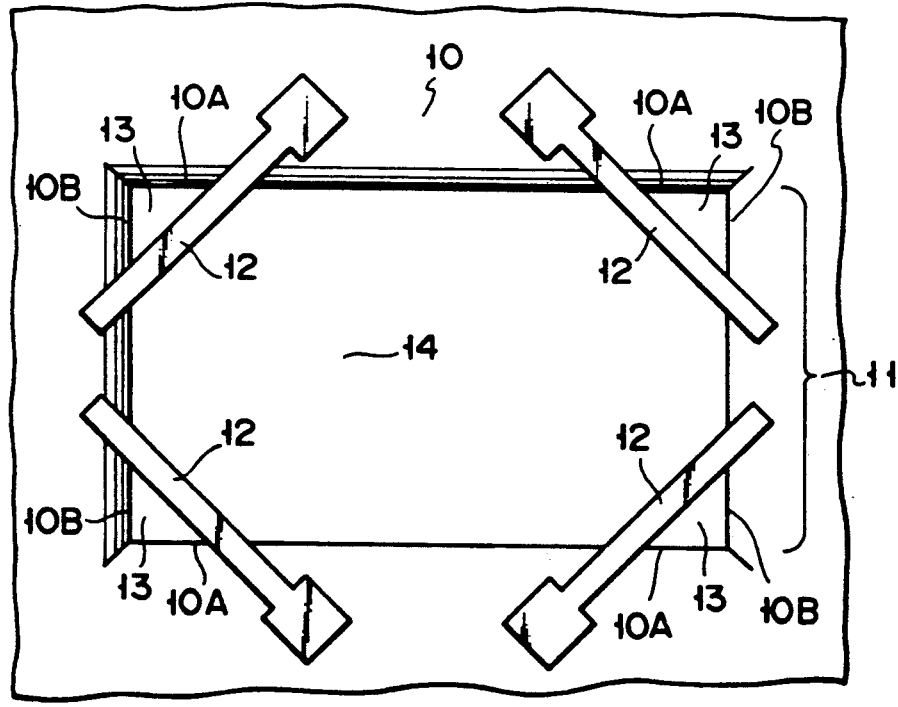
FIG. 10 is a plan view of a pattern showing a MOSFET according to the fourth embodiment of the present invention.

In the sense amplifier shown in FIG. 4, the NMOSs Q20 to Q26 are actuated in advance, and PMOSs Q28 to Q34 are actuated after the NMOSs are actuated. For this reason, good matching is required in the NMOSs, and the above arrangement is applied to only at least the NMOSs. The above arrangement may be applied to an element region 11P. In FIG. 10, the gates 22H and 22F of the PMOSs Q32 and Q34 ar formed to be in contact with an end 10C, and the gates 22E and 22G of the PMOSs Q28 and Q30 are formed to be in contact with an end 10D.

According to the sense amplifier with the above arrangement, even when masks for patterning, e.g., gate electrodes 22A to 22H are shifted in a direction X or Y, amounts of mask shifting are equal to each other in two MOSFETs such a the NMOSs Q20 and Q22 formed to be in contact with the same end of the field region 10. For this reason, amounts of shifting of gate widths W caused by shifting masks are equal to each other in the NMOSs Q20 and Q22, and the characteristics of the MOSFETs thereof are equal to each other. As a result, MOSFETs each having a gate electrode contacting the end of the field region 10 along one direction thereof have good matching.

Third Embodiment

The third embodiment will be described below with reference to FIG. 9. The same reference numerals as in FIG. 2 denote the same parts in FIG. 9, and a detailed description thereof will be omitted.

Figure 9:
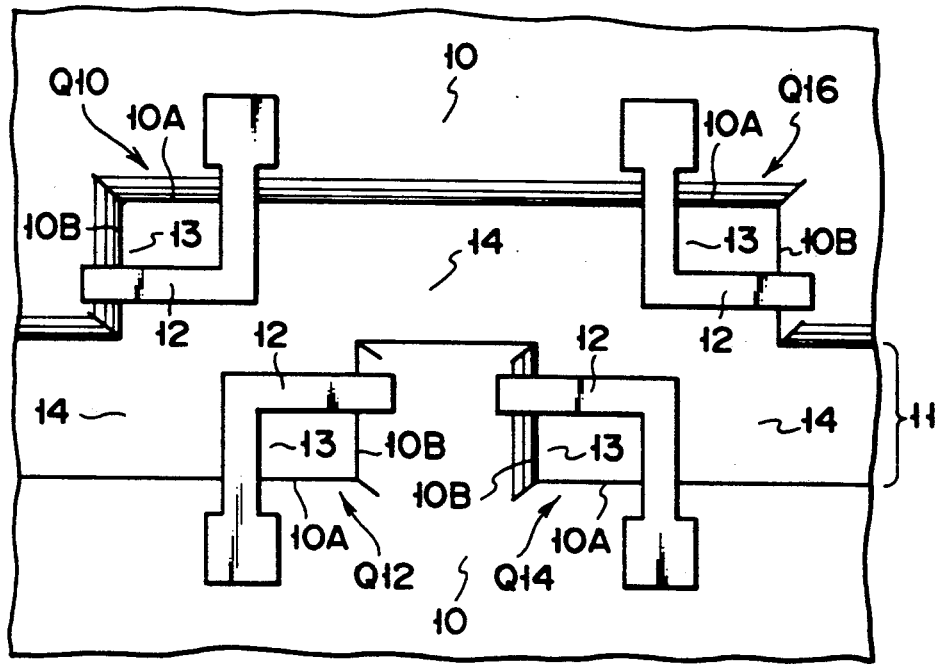
FIG. 9 is a plan view of a pattern showing a MOSFET according to the third embodiment of the present invention.

As shown in FIG. 9, a gate electrode 12 is curved once to extend its both ends to field region ends 10A and 10B at each corner of an element region, and the field region end 10A is adjacent to the field region end 10B, thereby obtaining a drain electrode 13. An element region 11 except for the region surrounded by the gate electrode 12 is used as a source electrode 14.

In the above arrangement, the same effect as described in the first embodiment can be obtained.

Fourth Embodiment

The fourth embodiment will be described below with reference to FIG. 10. FIG. 10 is a plan view of a pattern showing a MOSFET according to the fourth embodiment of the present invention. The same reference numerals as in FIG. 2 denote the same parts in FIG. 10, and a detailed description thereof will be omitted.

In the third embodiment, both the ends of the gate electrode 12 are formed at each corner of the element region to extend to the field region ends 10A and 10B which are adjacent to each other, and the electrode 12 is curved once, thereby obtaining the drain electrode 13.

In the fourth embodiment, as shown in FIG. 10, a linear gate electrode 12 which is not curved is formed across the field region ends 10A and 10B, thereby obtaining a drain electrode 13.

With the above arrangement, the same effect as described in the first embodiment can be obtained.

Fifth Embodiment

A MOSFET according to the present invention has a U-shaped gate electrode as described in the first embodiment. Both the ends of the gate electrode having such a shape are across the same end of a field region. As in the third and fourth embodiments, both the ends of the gate electrode cover the ends of field regions which are adjacent to each other. In other words, the gate electrode of the MOSFET according to the present invention does not cover the ends of field regions which are opposite to each other, and the gate electrode does not divide the element region. For this reason, the gate width (almost equal to a channel width) cannot be defined by the width of the element region. When a mask for patterning the gate electrode is shifted, the gate width is varied, and the characteristics of the MOSFET are varied.

As described above, the gate width is easily varied. In order to solve this problem, in the fifth embodiment, when a gate length required to actuate a MOSFET is set to be L1, a region 15 having a gate length L2 larger than the gate length L1 is arranged so as to limit a gate width W.

FIG. 11 is a plan view of a pattern showing a MOSFET according to the fifth embodiment. The same reference numerals as in FIG. 2 denote the same parts in FIG. 11, and a detailed description thereof will be omitted.

As shown in FIG. 11, a gate electrode 12 of a MOSFET Q30 has the gate length L1 at a portion operated as a MOSFET, and the regions 15 each having the gate length L2 larger than the gate length L1 are arranged at both the ends of the gate electrode 12. The regions 15 partially cover an element region 11 and a field region 10.

According to the MOSFET Q30, in a region having the gate length L1, a sufficiently wide channel is open, and a sufficient source-drain current $I_D$ flows. In the region 15 having the gate length L2, since the gate length L2 is larger than the gate length L1, a threshold value $V_{TH}$ of the MOSFET is increased to make it difficult to open its channel. Therefore, the source-drain current $I_D$ does not flow in the region 15. That is, the gate width of the MOSFET is sufficiently large in only a portion immediately below a portion of the gate electrode 12 having the gate length L1. Therefore, the gate width W is limited to only the portion of the gate electrode 12 having the gate length L1. Even when a mask is shifted, the gate width W is not varied.

The source-drain current ID of the MOSFET shown in FIG. 11 will be practically calculated below.

In order to calculate the source-drain current $I_D$, the MOSFET Q30 is divided into a transistor Tr1 having the gate length L1 and a transistor Tr2 having the gate length L2. A current $I_D1$ of the transistor Tr1 is given by equation (7):

$$I_D1 = [(W - 2P)/L] \cdot \mu \cdot C_{OX} \cdot [(V_G - V_{TH}1) \cdot V_D - (V_D^2/2)] \quad (7)$$

In equation (7), reference symbol $\mu$ denotes effective mobility of carriers on a surface; $C_{OX}$ capacitance of a gate oxide film; $V_G$, a gate-source voltage; $V_{TH}1$, a threshold value of the transistor Tr1; and $V_D$ a drain source voltage.

As in equation (7), a current $I_D2$ of the transistor Tr2 can be expressed by equation (8):

$$I_D2 = [2P/(L + 2N)] \cdot \mu \cdot C_{OX} \cdot [(V_G - V_{TH}2) \cdot V_D - (V_D^2/2)] \quad (8)$$

In equation (8), reference symbol $V_{TH}2$ denotes a threshold value of the transistor Tr2.

The source-drain current $I_D$ of the MOSFET Q30 can be expressed by a sum of the drain current $I_D1$ of the transistor Tr1 and the drain current $I_D2$ of the transistor Tr2. Therefore, the drain current $I_D$ of the MOSFET Q30 is given by equation (9):

$$I_D = I_D1 + I_D2 \quad (9)$$

According to equation (8), when the value N is set to be large and the threshold value $V_{TH}2$ is increased, it is understood that the drain current $I_D2$ of the transistor Tr2 is decreased. Therefore, according to equation (9), it is understood that the drain current $I_D$ of the MOSFET Q30 can be set to be equal to the drain current $I_D1$ of the transistor Tr1. Assuming that the drain current $I_D1$ is varied due to mask shifting, the drain current $I_D1$ is rarely varied.

Note that, even when mask shifting occurs, when the region 15 covers the field region end 10A, the gate width of the transistor Tr1 is not varied, and the current $I_D1$ of the transistor Tr1 is not varied.

As described above, since the regions 15 each having a large gate length are respectively arranged on both the ends of the gate electrode 12, even when a mask for patterning the gate electrode 12 is shifted, when the regions 15 is located on the field region end 10A, the channel width W of the MOSFET Q30 is not varied.

Figure 13:
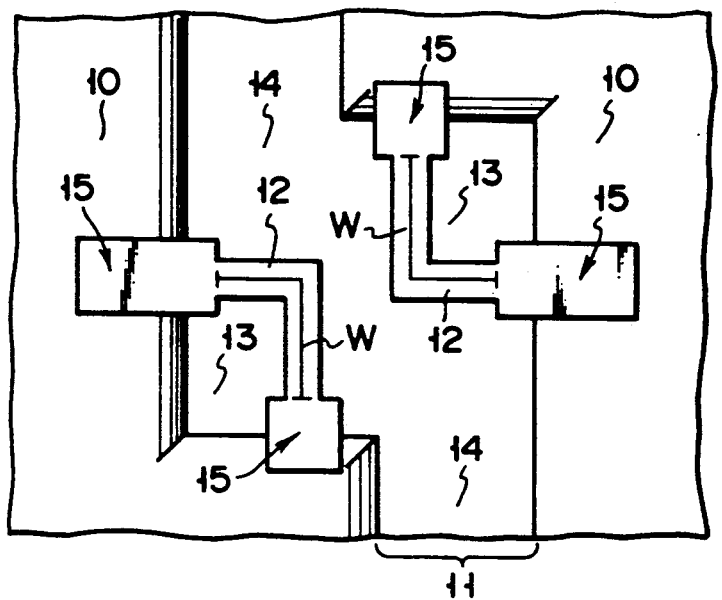
Figure 14:
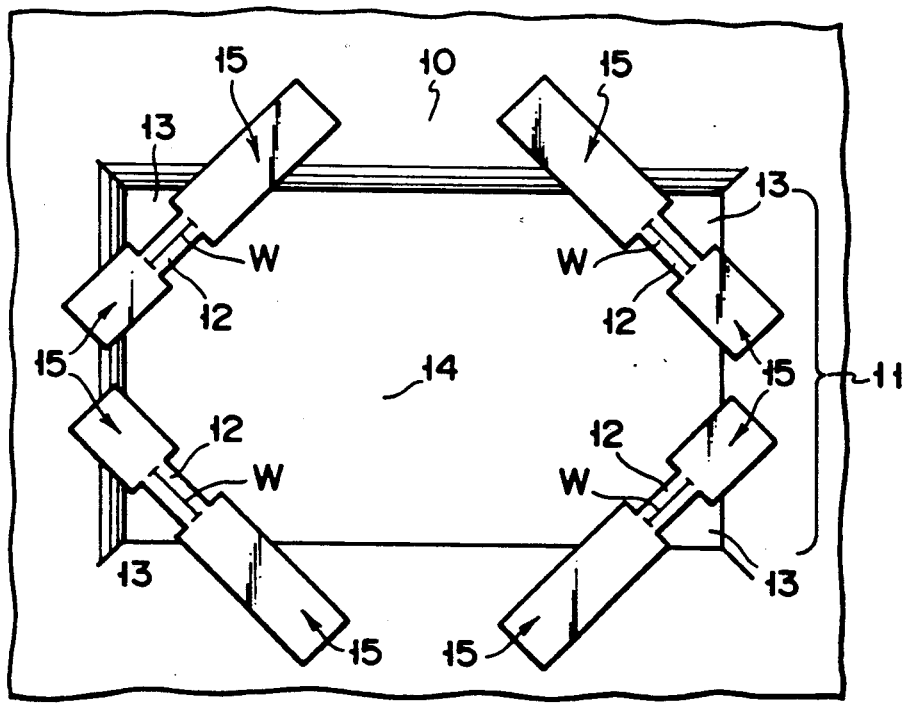

As shown in FIG. 12, the above method of limiting the channel width W can be applied to the second and third embodiments and can also be applied to the third and fourth embodiments as respectively shown in FIGS. 13 and 14. Note that the same reference numerals as in FIG. 11 denote the same parts in FIGS. 12 to 14.

Sixth Embodiment

The sixth embodiment will be described below with reference to FIGS. 15 and 16. The same reference numerals as in FIG. 2 denote the same parts in FIGS. 15 and 16, and a detailed description thereof will be omitted.

Figure 15:
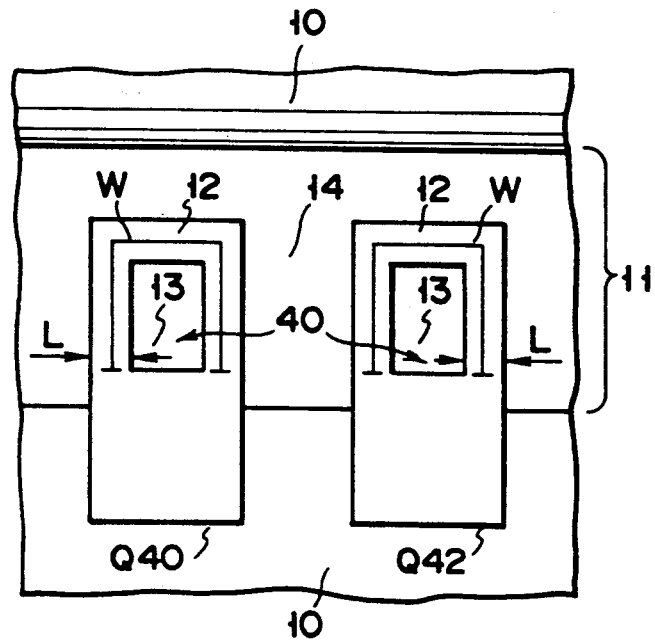
FIGS. 15 and 16 are plan views of a pattern showing a MOSFET according to the sixth embodiment of the present invention.

As shown in FIG. 15, an opening 40 is formed in a gate electrode 12 on an element region 11 so as to expose the element region 11. When a drain electrode 13 is formed in the opening 40, MOSFETs Q40 and Q42 having the same effect as described in the first embodiment can be obtained.

In this embodiment, since the opening 40 is formed in a portion of the gate electrode 12 having a sufficiently large width, when the opening 40 is formed, a portion of the gate electrode 12 having a short gate length L serves as the gate electrode 12. Therefore, since a gate width W is limited in a portion of the gate electrode 12 along the opening 40, even when a mask is shifted as in the fifth embodiment, the gate width W is not varied.

Figure 16:
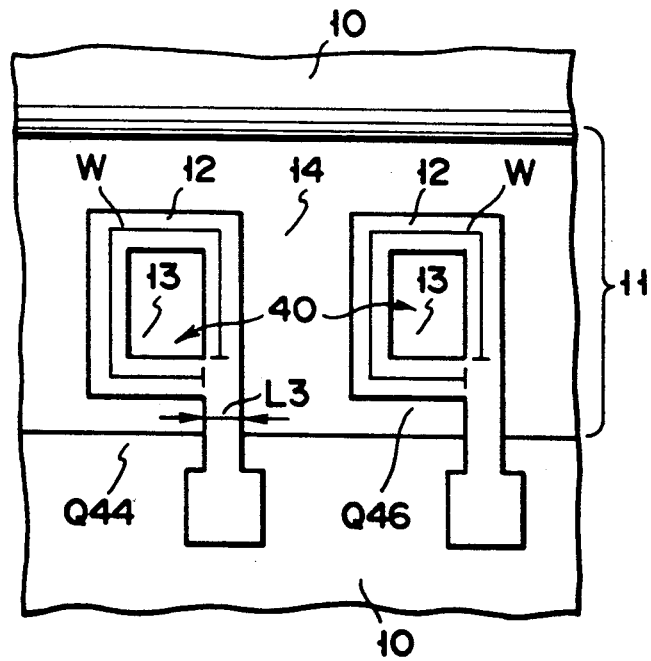

As shown in FIG. 16, each of the gate electrode 12 may be curved three times in the same direction to form the opening 40 described above. In this case, although a channel is open in each region having a gate length L3, the regions are on the single source electrode 14 and have the same potential. Therefore, even when the channel is open, no current flows. In the MOSFETs Q44 and Q46 shown in FIG. 16, the gate widths W can be limited in portions along the openings 40, respectively, and the gate widths W are not varied even when a mask is shifted.

Seventh Embodiment

Figure 17:
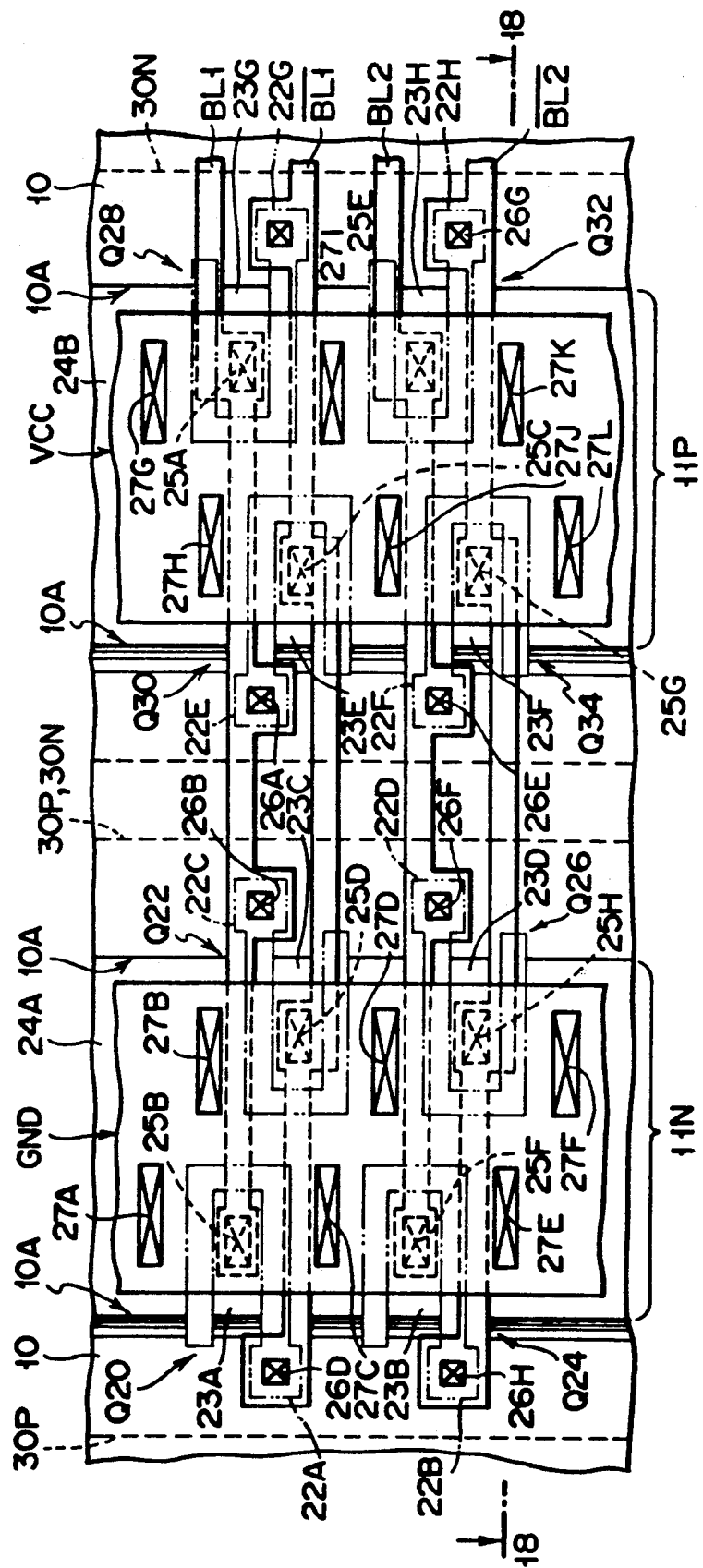
FIG. 17 is a plan view of a pattern showing a MOSFET according to the seventh embodiment of the present invention.
Figure 18:
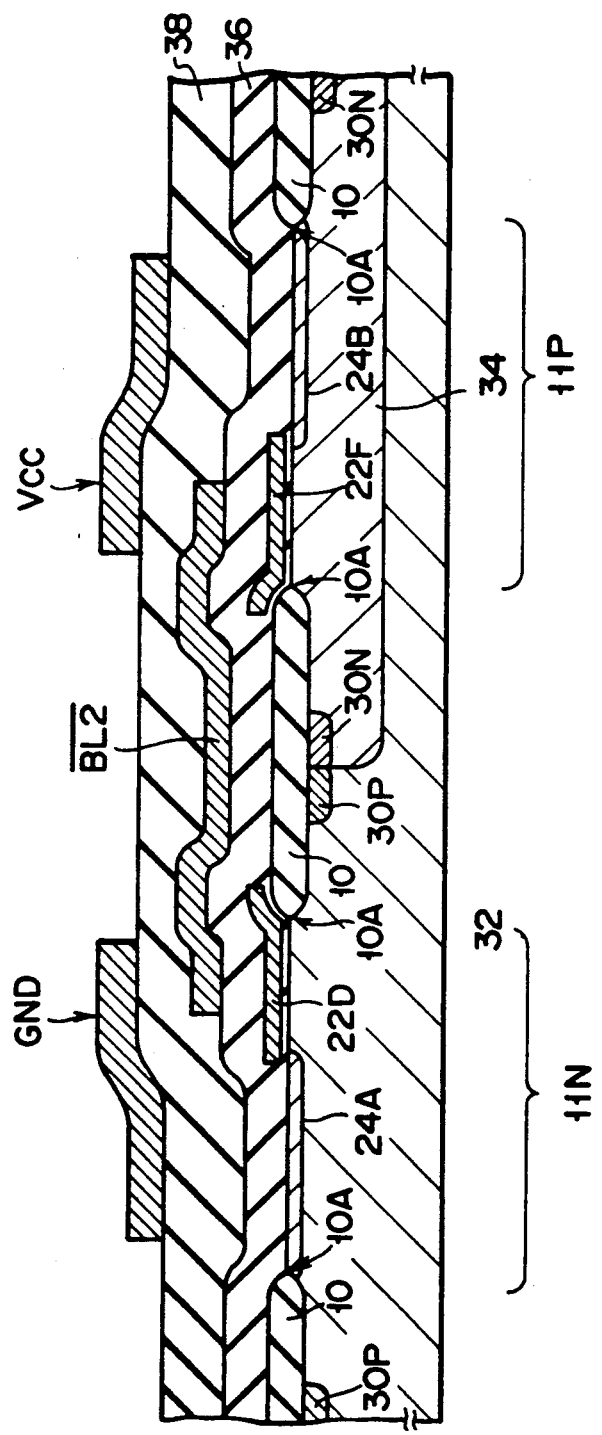
FIG. 18 is a sectional view showing the MOSFET along a line 18—18 in FIG. 17.

The seventh embodiment will be described below with reference to FIGS. 17 and 18. FIG. 17 is a plan view of a pattern showing a device according to the seventh embodiment, and FIG. 18 is a sectional view showing a device along a line 18—18 in FIG. 17. The same reference numerals as in FIG. 5B denote the same parts in FIGS. 17 and 18, and a detailed description thereof will be omitted.

As shown in FIGS. 17 and 18, an n-type well region 34 is formed in, e.g., a p-type silicon substrate 32. A field region 10 is formed in the surface region of the p-type silicon substrate 32. Various wires 22A to 22H, a GND, and a VCC are insulated by insulating films 36 and 38 and the like.

In a semiconductor device with the above arrangement, a channel stopper is formed immediately below the field region 10. Ion implantation for forming the channel stopper is generally performed to a prospective portion of the field region 10 as a whole. However, an impurity for forming the channel stopper is diffused in the vertical direction by thermal hysterisis of a manufacturing process and oozed in element regions 11N and 11P. Therefore, an effective channel width $W_{eff}$ (channel width ≈ gate width) of each of MOSFETs formed in the element regions 11N and 11P is decreased. This problem typically occurs when boron having a high diffusion coefficient is used as the above impurity.

In a MOSFET according to the present invention, since both the ends of the gate electrode 12 are across the same field region end, an influence of a decrease in effective channel width $W_{eff}$ caused by oozing the impurity for the channel stopper remarkably appears.

In the MOSFET shown in FIG. 11, it is assumed that such an impurity for a channel stopper is oozed in an element region and diffused to the region of the transistor Tr1 through the region of the transistor Tr2. At this time, assuming that the length of a vertical diffusion reaching the region of the Tr1 is set to be reference symbol Q, a decrease in effective channel width $W_{eff}$ is given by equation (10):

$$W_{eff} = (W - 2P) - 2Q \quad (10)$$

In a case wherein two MOSFETs each having a U-shaped gate electrode and shown in FIG. 12 are opposed to each other, it is assumed that a mask is shifted. Assuming that an amount of mask shifting is set to be reference symbol M, effective channel widths $W_{eff}1$ and $W_{eff}2$ of the two MOSFETs are expressed by equations (11) and (12):

$$W_{eff}1 = (W - 2P - 2Q) - 2M \quad (11)$$

$$W_{eff}2 = (W - 2P - 2Q) + 2M \quad (12)$$

According to equations (11) and (12), the channel widths $W_{eff}1$ and $W_{eff}2$ of the two MOSFETs are largely different from each other. As a result, characteristics of the MOSFETs have a large difference, and matching between the MOSFETs is degraded. For this reason, the MOSFETs are not suitable for a circuit such as a sense amplifier for performing a comparing operation.

As shown in FIGS. 17 and 18, thermal hysterisis in a manufacturing process is considered, and ion-implanted regions 30P and 30N in which an impurity for forming a channel stopper is ion-implanted are separated from the field region 10A. In order to obtain this arrangement, before thermal oxidation is performed in a LOCOS process for forming, e.g., a field region 10, the ion-implanted regions 30P and 30N are limited by, e.g., a photoresist film or the like.

Since the ion-implanted regions 30P and 30N are separated from a field region end 20A, a decrease or a variation in effective channel widths $W_{eff}$ of the MOSFETs Q20 to Q32 can be suppressed. In the resultant MOSFET, the effective channel width $W_{eff}$ is not decreased. Therefore, a MOSFET suitable for a circuit such as a sense amplifier for performing a comparing operation can be provided. In addition, in this embodiment, MOSFETs each having a small variation in effective channel width $W_{eff}$ can be integrated at a high density.

The present invention is not limited to the above embodiments, and various changes and modifications may be effected therein by one skilled in the art without departing from the spirit and scope of the invention. The various MOSFETs described in the above embodiments can be applied to not only a CMOS sense amplifier, but various circuits such as a multiplexer and a demultiplexer with the above effect. Since the MOSFETs can be changed into MESFETs, the FETs can be used as not only MOSFETs but MESFETs.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device, comprising:
    a semiconductor substrate of a first conductivity type;
    an element isolation film formed on a major surface of said semiconductor substrate to define an element region, a boundary of said element region formed by said element isolation film;
    at least first, second, third, and fourth current terminal regions of a second conductivity type formed in said element region; and
    electrodes formed on a surface of said element region above respective channels between said current terminal regions and having respective electrode lengths defined in accordance with a direction parallel to a current flow between said current terminal regions via said respective channels, whereby said current thermal regions and said electrodes form at least three field effect transistors.

2. The semiconductor device according to claim 1, wherein said first, second, and third current terminal regions comprise drain regions of said field effect transistors.

3. The semiconductor device according to claim 1, wherein said fourth current terminal region comprises a current terminal region common to said field effect transistors.

4. The semiconductor device according to claim 3, wherein said fourth current terminal region comprises a source region.

5. The semiconductor device according to claim 1, wherein said element isolation film forms a boundary including first and second sides substantially perpendicular to each other, at least one of said electrodes having a main electrode section, a first end section at least partially arranged on a portion of said element isolation film defining the first side of the boundary, and a second end section at least partially arranged on a portion of said element isolation film defining the second side of the boundary.

6. The semiconductor device according to claim 5, wherein said at least one electrode has a substantially linear configuration.

7. The semiconductor device according to claim 6, wherein said main electrode section has a first length and said first and second end sections have a second length greater than the first length.

8. The semiconductor device according to claim 5, wherein said at least one electrode has a substantially L-shaped configuration.

9. The semiconductor device according to claim 8, wherein said main electrode section has a first length and said first and second end sections have a second length greater than the first length.

10. The semiconductor device according to claim 1, wherein said element isolation film forms a boundary including a first side, at least one of said electrodes having a main electrode section, a first end section at least partially arranged on a first portion of said element isolation film defining the first side of the boundary, and a second end section at least partially arranged on a second portion of said element isolation film defining the first side of the boundary.

11. The semiconductor device according to claim 10, wherein said main electrode section has a first length and said first and second end sections have a second length greater than the first length.

12. The semiconductor device according to claim 10, wherein said at least one electrode has a substantially U-shaped configuration.

13. The semiconductor device according to claim 1, wherein each of said first, second, and third current terminal regions respectively contact the boundary of said element region.

14. The semiconductor device according to claim 13, wherein said electrodes include a main electrode section and first and second end sections, each of said first and second end sections having a first portion arranged on said element isolation film and a second portion arranged on said element region.

15. The semiconductor device according to claim 14, wherein said main electrode sections of said electrodes have a first length and said first and second end sections of said electrodes have a second length greater than the first length.

16. The semiconductor device according to claim 1, wherein said first, second, and third current terminal regions each comprise a region having at least three sides in a plan view, one of said at least three sides contacting the boundary.

17. The semiconductor device according to claim 16, wherein said electrodes include a main electrode section and first and second end sections, each of said first and second end sections having a first portion arranged on said element isolation film and a second portion arranged on said element region.

18. The semiconductor device according to claim 17, wherein said main electrode sections of said electrodes have a first length and said first and second end sections of said electrodes have a second length greater than the first length.

19. The semiconductor device according to claim 1, wherein said first, second, and third current terminal regions each comprise a region having at least three sides in a plan view, two of said at least three sides contacting the boundary.

20. The semiconductor device according to claim 19, wherein said electrodes include a main electrode section and first and second end sections, each of said first and second end sections having a first portion arranged on said element isolation film and a second portion arranged on said element region.

21. The semiconductor device according to claim 20, wherein said main electrode sections of said electrodes have a first length and said first and second end sections of said electrodes have a second length greater than the first length.

22. The semiconductor device according to claim 1, further comprising:
a channel stopper of the first conductivity type formed below said element isolation film and spaced from said element region.

23. The semiconductor device according to claim 22, wherein an impurity concentration of said channel stopper is greater than an impurity concentration of said semiconductor substrate.

24. The semiconductor device according to claim 1, wherein said element isolation film comprises an insulating film.

25. The semiconductor device according to claim 1, wherein said field effect transistors comprise MOS-FETs.

26. The semiconductor device according to claim 1, wherein said electrodes include a main electrode section having a first length and first and second end sections having a second length greater than the first length, each of said first and second end sections having a first portion arranged on said element isolation film and a second portion arranged on said element region.

27. A semiconductor device, comprising:
a semiconductor substrate of a first conductivity type;
a semiconductor region of a second conductivity type formed in said semiconductor substrate;
an element isolation film formed on a major surface of said semiconductor substrate to define a first element region and to define a second element region on said semiconductor region, boundaries of said first and second element regions formed by said element isolation film;
at least first, second and third current terminal regions of the second conductivity type formed in said first element region;
first electrodes formed on a surface of said first element region above respective first channels between said current terminal regions and having electrode lengths defined in accordance with a direction parallel to a current flow between said current terminal regions via said respective first channels, whereby said first, second, and third current terminal regions and said first electrodes form at least two field effect transistors of the first channel conductivity type;
at least fourth, fifth, and sixth current terminal regions of the first conductivity type formed in said second element region;

second electrodes formed on a surface of said second element region above respective second channels between said current terminal regions and having electrode lengths defined in accordance with a direction parallel to a current flow between said current terminal regions via said respective second channels, whereby said fourth, fifth, and sixth current terminal regions and said second electrodes form at least two field effect transistors of the second channel conductivity type.

28. The semiconductor device according to claim 27, wherein said first, second, fourth and fifth current terminal regions comprise drain regions of said field effect transistors.

29. The semiconductor device according to claim 27, wherein said third current terminal region comprises a current terminal region common to said field effect transistors of the first channel conductivity type and said sixth current terminal region comprises a current terminal region common to said field effect transistors of the second channel conductivity type.

30. The semiconductor device according to claim 29, wherein said third and sixth current terminal regions comprise source regions.

31. The semiconductor device according to claim 27, wherein said element isolation film forms a boundary for said first element region including a first side, at least one of said first electrodes including a main electrode section, a first end section at least partially arranged on a first portion of said element isolation film defining the first side of the boundary, and a second end section at least partially arranged on a second portion of said element isolation film defining the first side of the boundary.

32. The semiconductor device according to claim 31, wherein said main electrode section has a first length and said first and second end sections have a second length greater than the first length.

33. The semiconductor device according to claim 31, wherein said at least one first electrode is substantially U-shaped.

34. The semiconductor device according to claim 27, wherein said element isolation film forms a boundary for said second element region including a first side, at least one of said second electrodes having a main electrode section, a first end section at least partially arranged on a first portion of said element isolation film defining the first side of the boundary, and a second end section at least partially arranged on a second portion of said element isolation film defining the first side of the boundary.

35. The semiconductor device according to claim 34, wherein said main electrode section has a first length and said first and second end sections have a second length greater than the first length.

36. The semiconductor device according to claim 27, wherein said field effect transistors comprise MOS-FETs.

37. A sense amplifier for amplifying a potential difference between a bit line pair, comprising:
a semiconductor substrate of a first conductivity type;
a semiconductor region of a second conductivity type formed in said semiconductor substrate;
an element isolation film formed on a major surface of said semiconductor substrate to define a first element region and to define a second element region on said semiconductor region, boundaries of said first and second element regions formed by said element isolation film;
first, second, and third current terminal regions of the second conductivity type formed in said first element region;
first and second electrodes formed on a surface of said first element region above respective first channels between said first and third and said second and third current terminal regions and having respective electrode lengths defined in accordance with a direction parallel to a current flow between said current terminal regions via said respective first channels, whereby said first, second, and third current terminal regions and said first and second electrodes form first and second field effect transistors;
fourth, fifth, and sixth current terminal regions of the first conductivity type formed in said second element region;
third and fourth electrodes formed on a surface of said second element region above respective second channels between said fourth and sixth and said fifth and sixth current terminal regions and having respective electrode lengths defined in accordance with a direction parallel to a current flow between said respective second channels, whereby said fourth, fifth, and sixth current terminal regions and said third and fourth electrodes form third and fourth field effect transistors;
a first power source line in contact with said third current terminal region;
a second power source line in contact with said sixth current terminal region;
a first bit line coupled to said first current terminal region, said first electrode, said third electrode, and said fourth current terminal region; and
a second complementary bit line coupled to said second current terminal region, said second electrode, said fourth electrode, and said fifth current terminal region.

38. The sense amplifier according to claim 37, wherein said first, second, fourth, and fifth current terminal regions comprise drain electrodes of said field effect transistors.

39. The sense amplifier according to claim 37, wherein said third current terminal region comprises a current terminal region common to said first and second field effect transistors and said sixth current terminal region comprises a current terminal region common to said third and fourth field effect transistors.

40. The sense amplifier according to claim 37, wherein said field effect transistors comprise MOS-FETs.

41. The sense amplifier according to claim 37, wherein said element isolation film forms a boundary for said first element region including a first side, at least one of said first and second electrodes having a main electrode section, a first end section at least partially arranged on a first portion of said element isolation film defining the first side of the boundary, and a second end section at least partially arranged on a second portion of said element isolation film defining the first side of the boundary.

42. The sense amplifier according to claim 41, wherein said main electrode section has a first length and said first and second end sections have a second length greater than the first length.

43. The sense amplifier according to claim 37, wherein said element isolation film forms a boundary for said second element region including a first side, at least one of said third and fourth electrodes having a main electrode section, a first end section at least partially arranged on a first portion of said element isolation film defining the first side of the boundary, and a second end section at least partially arranged on a second portion of said element isolation film defining the first side of the boundary.

44. The sense amplifier according to claim 43, wherein said main electrode section has a first length and said first and second end sections have a second length greater than the first length.

45. The sense amplifier according to claim 37, further comprising:
   a channel stopper formed below said element isolation film and spaced from said first and second element regions.

46. A semiconductor device, comprising:
   a semiconductor substrate of a first conductivity type;
   an element isolation film formed on a major surface of said semiconductor substrate to define an element region, a boundary of said element region formed by said element isolation film;
   at least first, second, third, and fourth current terminal regions of a second conductivity type formed in said element region;
   electrodes formed on a surface of said element region above respective channels between said current terminal regions and having electrode lengths defined in accordance with a direction parallel to a current flow between said current terminal regions via said respective channels, said electrodes comprising a single end portion at least partially arranged on said element isolation film and a main electrode portion whereby said current terminal regions and said electrodes form at least three field effect transistors.

* * * * *